(12) United States Patent
Goeke

(10) Patent No.: US 7,586,314 B2
(45) Date of Patent: Sep. 8, 2009

(54) MULTI-PIN CV MEASUREMENT

(75) Inventor: Wayne C. Goeke, Hudson, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 317 days.

(21) Appl. No.: 11/758,940

(22) Filed: Jun. 6, 2007

(65) Prior Publication Data

US 2008/0303535 A1 Dec. 11, 2008

(51) Int. Cl.
G01R 27/02 (2006.01)
G01R 31/26 (2006.01)

(52) U.S. Cl. .............. 324/609; 324/769; 324/691; 324/658; 324/765; 257/48

(58) Field of Classification Search .......... 324/609, 324/769, 649
See application file for complete search history.

(56) References Cited

U.S. PATENT DOCUMENTS

| | | | | |
|---|---|---|---|---|
| 6,295,630 B1 * | 9/2001 | Tamegaya | ............ | 716/4 |
| 6,646,462 B1 * | 11/2003 | Yang et al. | ............ | 324/769 |
| 6,812,730 B2 * | 11/2004 | Pan | ............ | 324/769 |
| 6,885,214 B1 * | 4/2005 | Su et al. | ............ | 324/765 |
| 7,176,706 B2 * | 2/2007 | Toshiyuki et al. | ............ | 324/765 |
| 7,242,200 B2 * | 7/2007 | Okawa | ............ | 324/713 |
| 7,405,090 B2 * | 7/2008 | Jang | ............ | 438/14 |
| 2003/0146763 A1 * | 8/2003 | Sunter | ............ | 324/527 |
| 2009/0072887 A1 * | 3/2009 | Scheikl et al. | ............ | 327/530 |

OTHER PUBLICATIONS

Efficient Microwave Bias and Testing Using the HP 4142B Modular DC Source/Monitor. Hewlett Packard. Application Note 1205 (Date: At least as early as Aug. 30, 2006.).

* cited by examiner

Primary Examiner—Timothy J Dole
Assistant Examiner—John Zhu
(74) Attorney, Agent, or Firm—Pearne & Gordon LLP

(57) ABSTRACT

A method for measuring electrical parameters of a DUT having at least three terminals includes applying a first AC voltage to a first terminal; separately driving a second and a third terminal each to a virtual second AC voltage, each virtual voltage requiring a respective current; and measuring an electrical parameter of the DUT based on the first AC voltage and the second and third terminals each being at the virtual second AC voltage.

12 Claims, 4 Drawing Sheets

MULTI-PIN CV MEASUREMENT

BACKGROUND OF THE INVENTION

The present invention relates to precision AC measurements and, in particular, to impedance measurements.

It is often desired to make both IV and CV (or LCR) measurements on a device under test (DUT). Typically, switching between IV and CV measurements on DUTs having at least three terminals (e.g., a MOSFET or BJT) has required either re-cabling at the DUT or locating switching circuitry close to the DUT. This is because two or more of the terminals are shorted together at, or near, the DUT to avoid high frequency reflections, while for IV measurements the terminals are typically not shorted.

Referring to FIG. 1, a typical prior art configuration for a CV measurement for a DUT 12 (4-terminal MOSFET) is shown. The capacitors 14, 16, 18, 20 are leakage capacitances to ground. A voltage 22 is applied to one side of the DUT 12. The shorted point 24 of the DUT 12 is connected to an auto balance bridge (ABB) 26. The ABB 26 forces the shorted point 24 to a virtual ground and measures the current 28 required to do so. Because the point 24 is at virtual ground, there is no potential across the capacitors 16, 18, 20 and thus no leakage current. The voltage 22 and the current 28 are then used to determine the impedance (Ohm's Law) across the DUT 12, independent of the leakage capacitances. It should be understood, that because of the duality of voltage and current, voltages and currents may be respectively interchanged and still produce the equivalent results.

SUMMARY OF THE INVENTION

A method for measuring electrical parameters of a DUT having at least three terminals includes applying a first AC voltage to a first terminal; separately driving a second and a third terminal each to a virtual second AC voltage, each virtual voltage requiring a respective current; and measuring an electrical parameter of the DUT based on the first AC voltage and the second and third terminals each being at the virtual second AC voltage.

DESCRIPTION OF THE PREFERRED EMBODIMENTS

Figure 2:
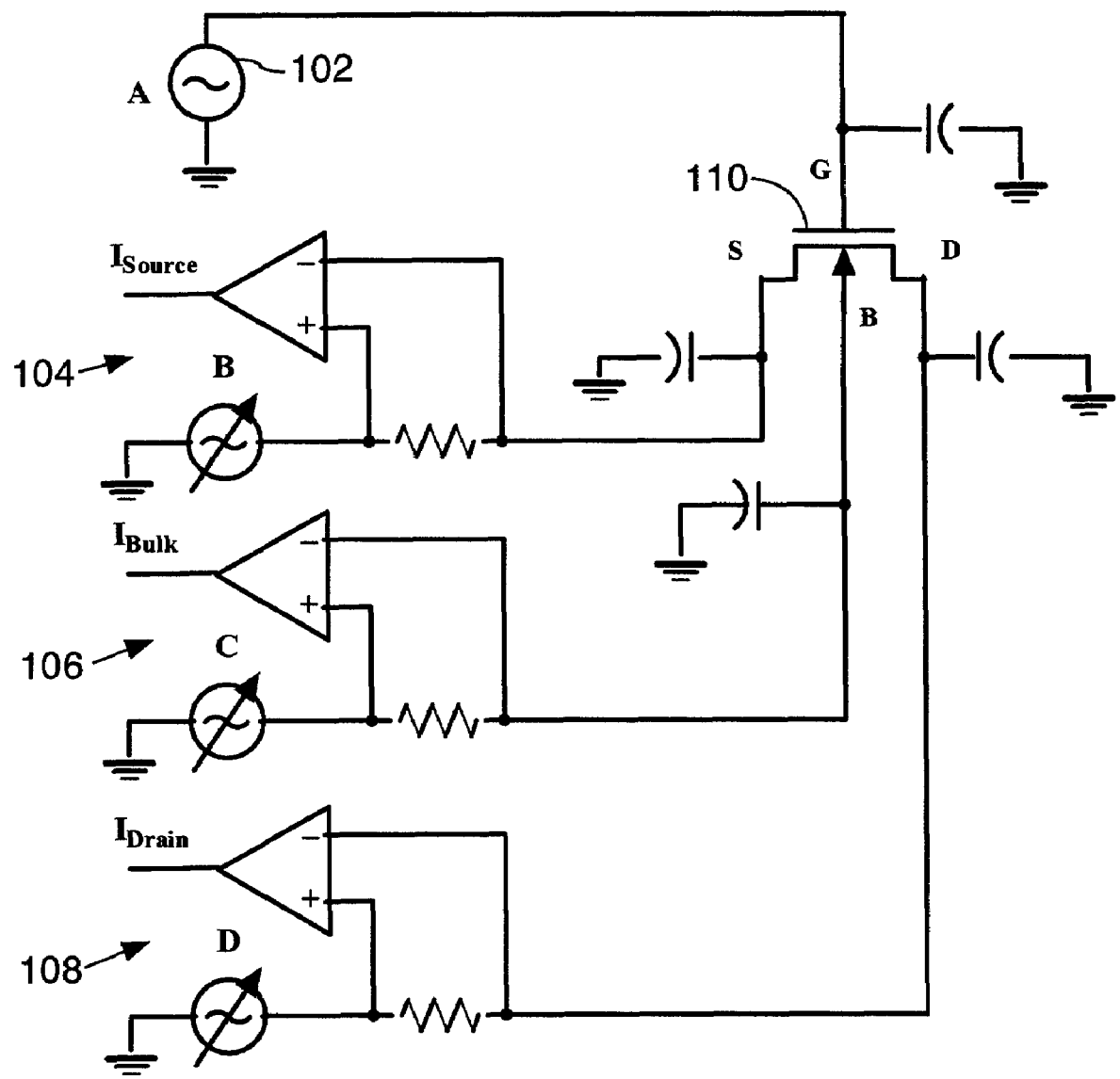
FIG. 2 is a schematic diagram of an example of a measurement system for using an aspect of the invention.

Referring to FIG. 2, a configuration for making CV measurements without shorting terminals includes a voltage source 102 for one terminal (e.g., the MOSFET gate) of the DUT 110 and an ABB 104, 106, 108 respectively for three other terminals of the DUT 110 (e.g., the MOSFET source, bulk and drain).

Figure 1:
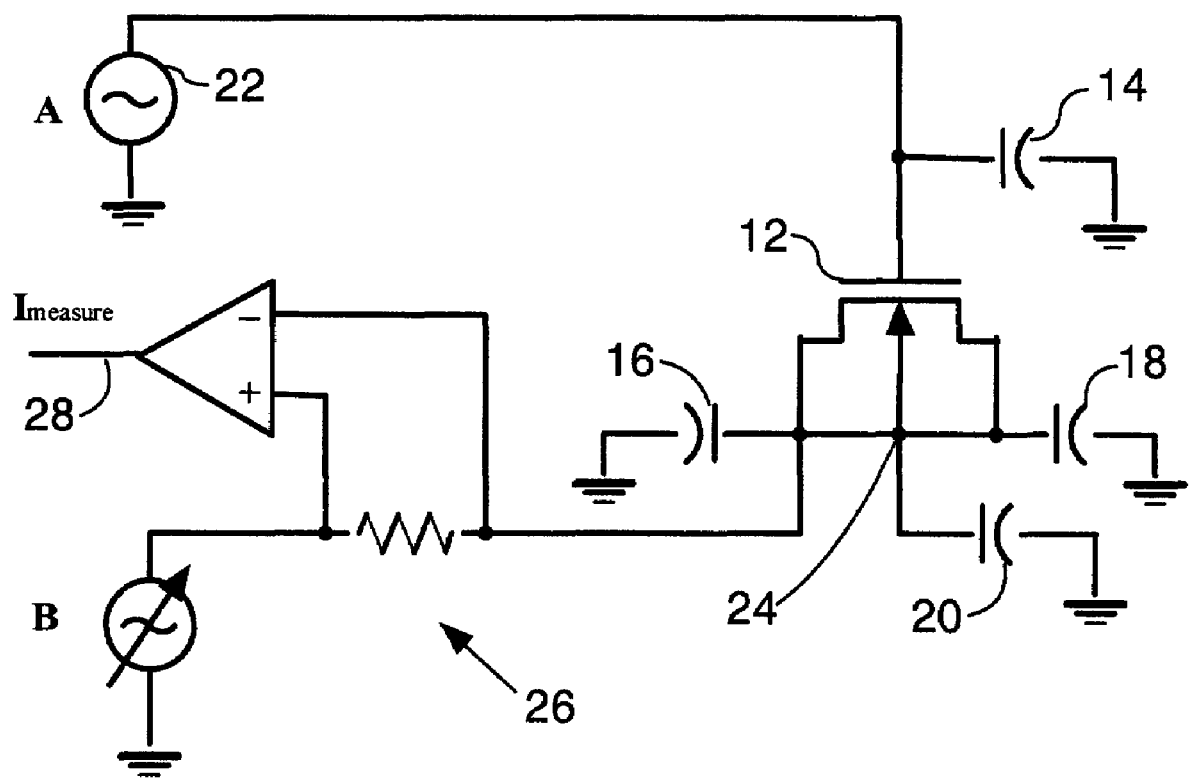
FIG. 1 is a schematic diagram of a prior art auto balance bridge measurement system.

The ABBs 104, 106, 108 each drive their respective terminals to a virtual ground. This virtually shorts the source, bulk and drain together allowing the same measurement of CV as in FIG. 1 to be made without actually making the shorting connection. The $I_{measure}=I_{Source}+I_{Bulk}+I_{Drain}$. This avoids the issues of re-cabling or providing switching circuitry at, or near, the DUT 110. In addition, the separate impedance of each of the terminals with respect to the gate terminal is now also available by using the gate voltage and the respective terminal current.

In general, if a DUT has at least three terminals, a first AC voltage is applied to the first terminal and the second and third terminal (or more) are each driven to a virtual second AC voltage, each virtual voltage requiring a respective current. An electrical parameter of the DUT is then measured based on the first AC voltage and the second and third terminals each being at the virtual second AC voltage.

Figure 3:
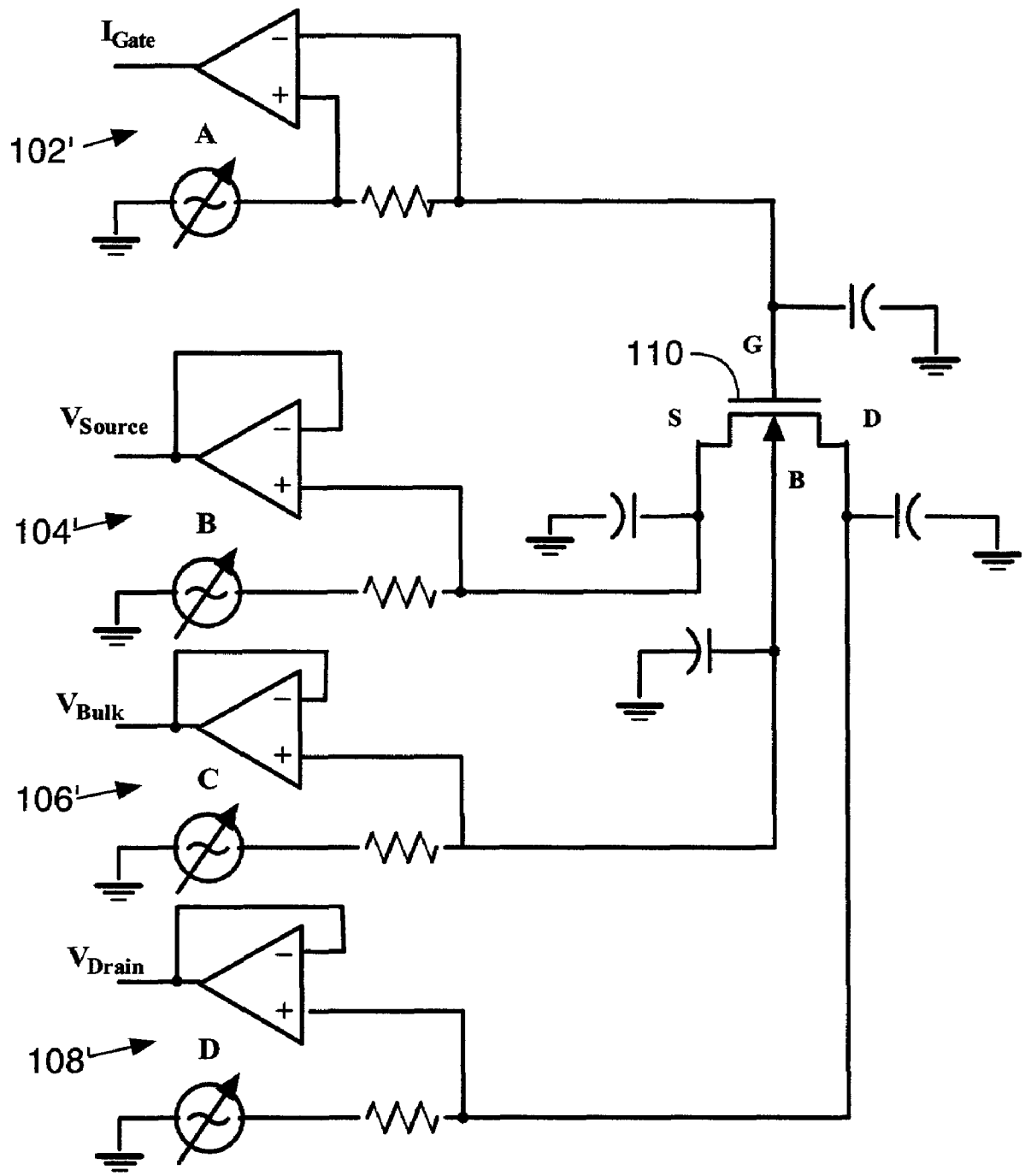
FIG. 3 is a schematic diagram of another example of a measurement system for using another aspect of the invention.

Referring to FIG. 3, a similar arrangement basically interchanges voltages and currents. An ABB 102' on the first terminal (e.g., the MOSFET gate) establishes a virtual ground that eliminates the gate leakage capacitance and measures the current required to do so. The AC sources 104', 106', 108' are each adjusted to provide the same magnitude and phase at the source, bulk and drain, respectively (no need to be zero). The measured voltages $V_{Source}$, $V_{Bulk}$ and $V_{Drain}$ can then be used with the measured gate current to determine all of the impedances, similar to method of FIG. 2.

Figure 4:
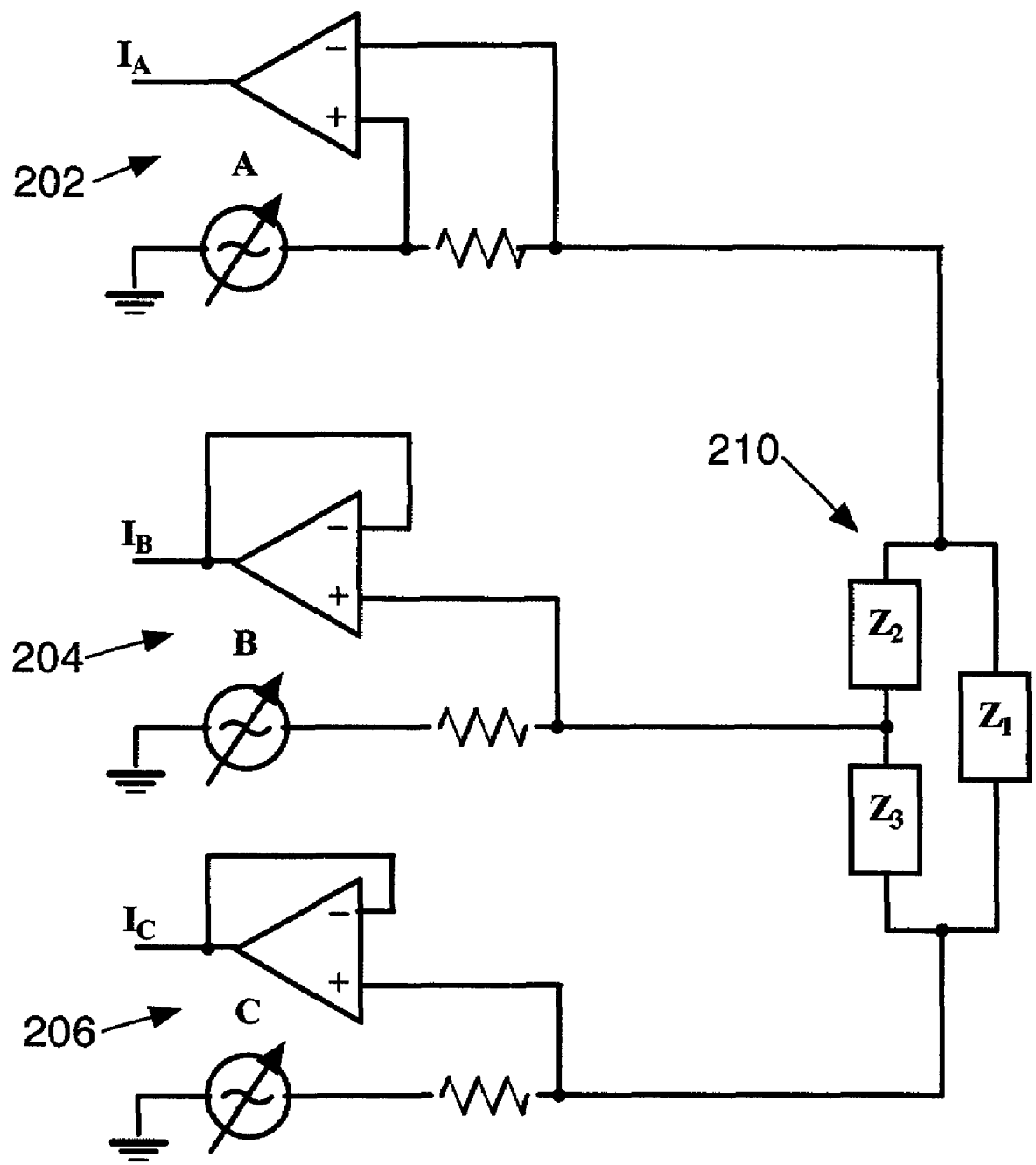
FIG. 4 is a schematic diagram of an additional example of a measurement system for using an additional aspect of the invention.

Referring to FIG. 4, a further extension of the method can be employed. As an example, a three-terminal DUT 210 can be considered to include three impedances, one between each terminal pair. A respective ABB 202, 204, 206 is connected to each terminal. When both ends of an impedance are driven to the same virtual potential (or equivalently to zero current), the impedance can be said to be guarded out, as it is effectively gone from the circuit. Then, for example, to measure the impedance $Z_1$ the ABBs 204, 206 are each driven to a virtual ground. This guards out the impedances $Z_2$ and $Z_3$ (because no current then flows through $Z_2$ and $Z_3$ to ABB 206. The voltage from ABB 202 and the current from ABB 206 then determine the value of $Z_1$.

In general, the virtual voltages and respective currents are used to measure the impedance of at least one pair of the first, second and third terminals (or more) by guarding out the impedances of the other pairs. Voltages may be referenced to other values than zero.

Besides the typically complex (e.g., magnitude and phase) AC values, the ABBs can be used to apply DC values such as biases.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for measuring electrical parameters of a DUT having at least three terminals, said method comprising:
    applying a first AC voltage to a first terminal;
    separately driving a second and a third terminal each to a virtual second AC voltage, each virtual voltage requiring a respective current; and
    measuring an electrical parameter of the DUT based on the first AC voltage and at least one of said respective currents.

2. A method according to claim 1, wherein said virtual second AC voltage is zero volts.

3. A method according to claim 1, wherein the virtual voltages and respective currents are used to measure the impedance between at least one pair of the first, second and third terminals by guarding out the impedances of the other pairs.

4. A method according to claim 1, where DC voltages are also applied to at least one of said second and third terminals.

5. A method according to claim 1, wherein the first voltage and the virtual voltage respective current is used to measure at least one of the capacitance between the first terminal and second terminal and between the first and third terminal.

6. A method according to claim 5, wherein said respective currents are combined to measure the capacitance between the first terminal and the combination of the second and third terminals.

7. A method for measuring electrical parameters of a DUT having at least three terminals, said method comprising:

driving a first terminal to a virtual first AC voltage requiring a current;

separately driving a second and a third terminal each to a second AC voltage, said second AC voltage requiring a respective drive voltage; and measuring an electrical parameter of the DUT based on the required current and the second and third terminal drive voltages.

8. A method according to claim 7, wherein said virtual first AC voltage is zero volts.

9. A method according to claim 7, wherein the virtual voltages and respective currents are used to measure the impedance between at least one pair of the first, second and third terminals by guarding out the impedances of the other pairs.

10. A method according to claim 7, where DC voltages are also applied to at least one of said second and third terminals.

11. A method according to claim 7, wherein the first required current and the terminal drivel voltages are used to measure at least one of the capacitance between the first terminal and second terminal and between the first and third terminal.

12. A method according to claim 11, wherein said drive voltages are combined to measure the capacitance between the first terminal and the combination of the second and third terminals.

\* \* \* \* \*